(12) United States Patent
König

(10) Patent No.: US 11,635,401 B2
(45) Date of Patent: Apr. 25, 2023

(54) SENSOR DEVICE, METHOD FOR MANUFACTURING A SENSOR DEVICE AND SENSOR ASSEMBLY

(71) Applicant: TDK Corporation, Tokyo (JP)

(72) Inventor: Matthias König, Munich (DE)

(73) Assignee: TDK CORPORATION, Tokyo (JP)

( * ) Notice: Subject to any disclaimer, the term of this patent is extended or adjusted under 35 U.S.C. 154(b) by 331 days.

(21) Appl. No.: 17/075,830

(22) Filed: Oct. 21, 2020

(65) Prior Publication Data

US 2021/0148845 A1    May 20, 2021

(30) Foreign Application Priority Data

Nov. 14, 2019    (DE) .......................... 102019130755.4

(51) Int. Cl.
*G01N 27/16* (2006.01)
*B81B 3/00* (2006.01)
*B81C 1/00* (2006.01)

(52) U.S. Cl.
CPC ........... *G01N 27/16* (2013.01); *B81B 3/0081* (2013.01); *B81C 1/00158* (2013.01); *B81C 1/00182* (2013.01); *B81B 2201/0278* (2013.01); *B81B 2203/0127* (2013.01)

(58) Field of Classification Search
CPC .................. G01N 27/16; B81B 3/0081; B81B 2201/0278; B81B 2203/0127; B81B 7/0029; B81C 1/00158; B81C 1/00182
See application file for complete search history.

(56) References Cited

U.S. PATENT DOCUMENTS

| | | |
|---|---|---|
| 5,048,336 A | 9/1991 | Sugihara et al. |
| 7,875,244 B2 * | 1/2011 | Schlichte ............... G01N 27/16 436/139 |
| 2004/0021184 A1 | 2/2004 | Benzel et al. |
| 2005/0025215 A1 | 2/2005 | Arndt et al. |
| 2009/0120162 A1 * | 5/2009 | Pratt ....................... G01N 27/16 73/23.31 |
| 2014/0208828 A1 * | 7/2014 | Von Waldkirch .... G01N 27/123 73/25.05 |
| 2016/0327392 A1 | 11/2016 | Kim et al. |
| 2019/0316941 A1 * | 10/2019 | König ..................... G01N 27/14 |
| 2020/0049647 A1 * | 2/2020 | König ..................... G01N 27/16 |

* cited by examiner

*Primary Examiner* — Francis C Gray

(74) *Attorney, Agent, or Firm* — Slater Matsil, LLP

(57) ABSTRACT

In an embodiment a sensor device includes a substrate with a first membrane and a first cover layer, the first membrane and the first cover layer being monolithically integrated into the substrate and a first pellistor element including a heater element and a temperature sensor element, the heater element and/or the temperature sensor element being arranged in or on the first membrane, wherein the first cover layer is arranged over or under the first membrane, and wherein the first membrane, the first cover layer and a part of the substrate surround a first cavity.

20 Claims, 5 Drawing Sheets

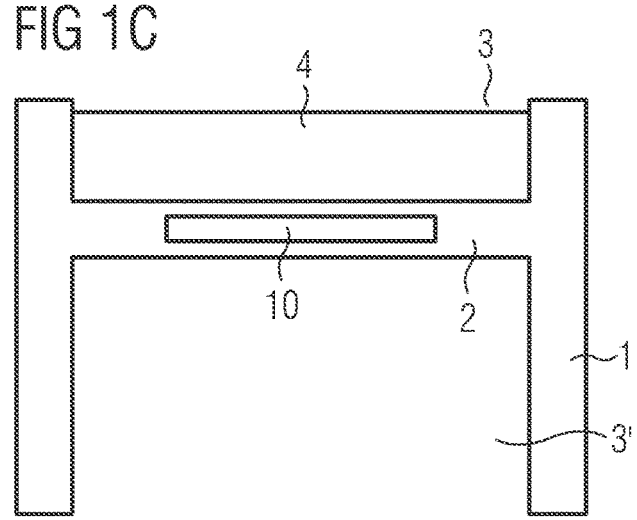
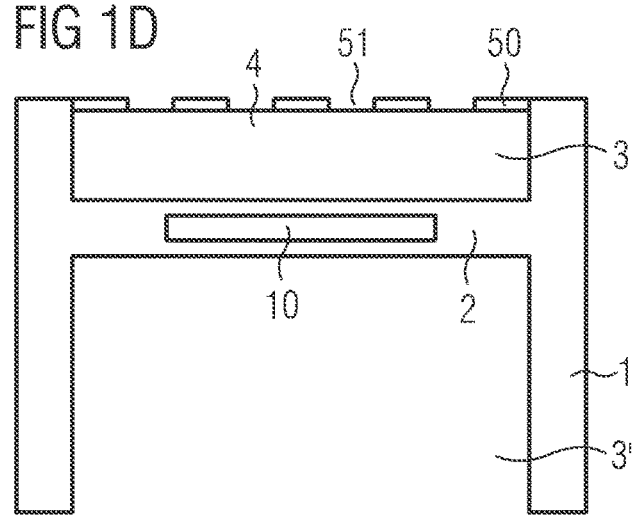
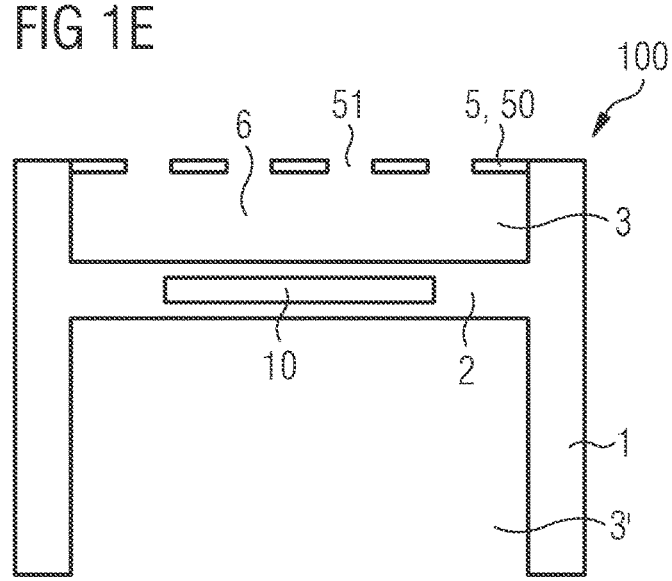

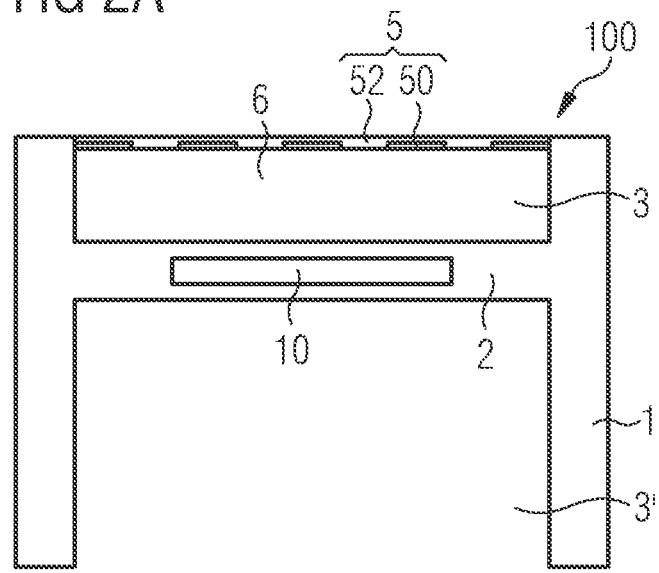
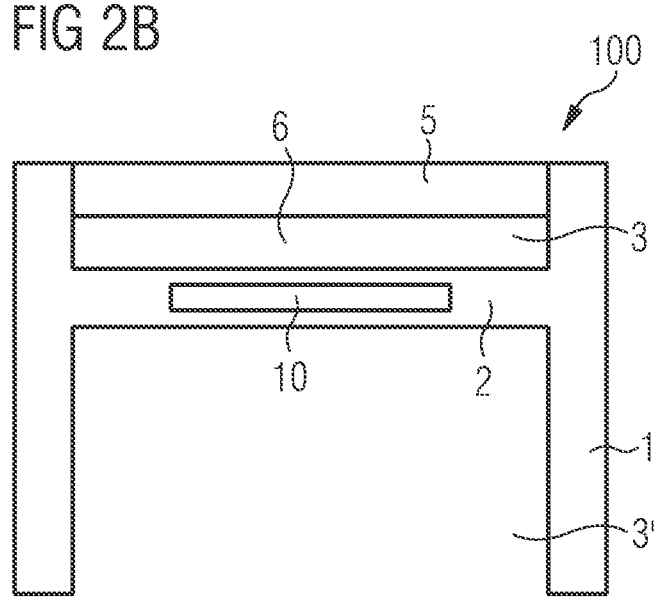

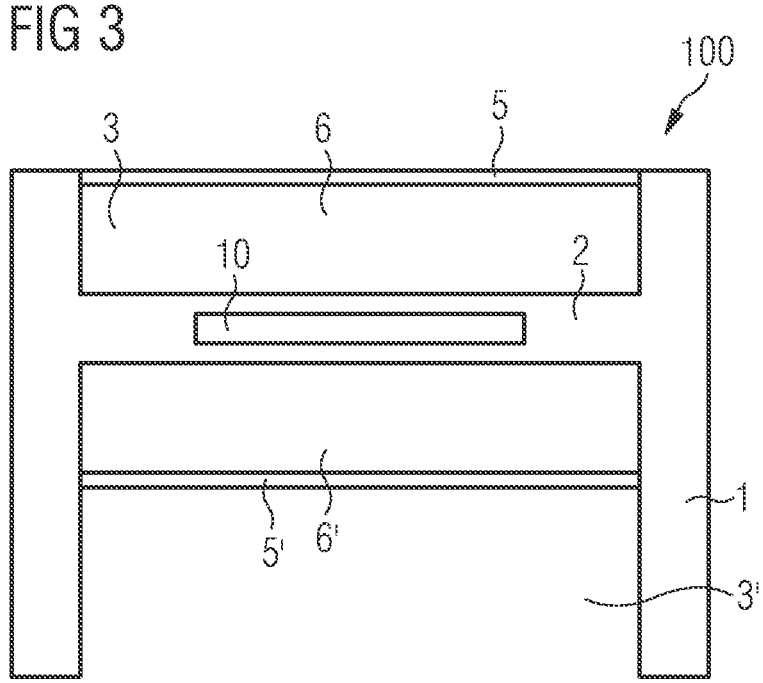
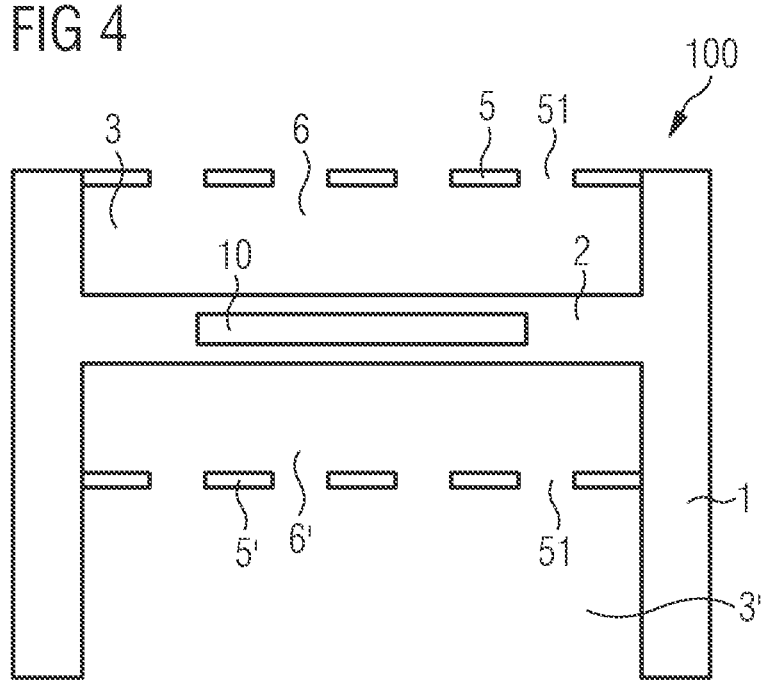

SENSOR DEVICE, METHOD FOR MANUFACTURING A SENSOR DEVICE AND SENSOR ASSEMBLY

CROSS-REFERENCE TO RELATED APPLICATIONS

This application claims priority to German Application No. 102019130755.4, filed on Nov. 14, 2019, which application is hereby incorporated herein by reference.

TECHNICAL FIELD

Embodiments of the present invention are related to a sensor device, a method for manufacturing a sensor device and a sensor assembly.

BACKGROUND

One possibility to build a miniaturized gas sensor for consumer mass market applications is the so called pellistor. There are two types of pellistors, namely catalytic pellistors and thermal conductivity (TC) pellistors, which can be distinguished by their different operating modes. A catalytic pellistor comprises a catalyst element and works by burning a gas to be examined at the catalyst element, which is heated by a heater. The additional heat that is generated by the gas combustion process can be detected and preferably can be used to produce a sensor signal that is proportional to the gas concentration. In a TC pellistor the catalyst element is missing. The TC pellistor measures the heat conductivity of the gas to be examined, since changes in the gas composition can cause changes in the thermal conductivity of the gas. However, the thermal conductivity effects are typically smaller than the catalytic effects, so that usually catalytic pellistors are preferred.

Measurable gas concentrations are in the range of percent for classical pellistors, since even in case of catalytic pellistors temperature changes usually are very small. However, by using more sensitive temperature elements it is also possible to measure in the ppm (parts per million) range.

The measured signals of pellistors in general show a strong dependence on changes of the ambient humidity, the ambient temperature and other drift effects. Therefore, a reference pellistor is needed that can be used to compensate humidity and temperature effects. In case of a catalyst pellistor a second, catalyst-free pellistor is used, which can be integrated on the same substrate as the catalyst pellistor. However, in case of a TC pellistor no smart solutions are known for an integrated structure comprising a reference pellistor.

SUMMARY

Embodiments provide a sensor device, preferably a sensor device that comprises functionalities of a gas sensor. Further embodiments provide a sensor assembly, preferably comprising such sensor device. Yet further embodiments provide a method for manufacturing a sensor device.

According to at least one embodiment, a sensor device comprises at least a first pellistor element. For instance, the sensor device can comprise exactly one pellistor element. Preferably, the sensor device can comprise a first and a second pellistor element and, thus, at least two pellistor elements or exactly two pellistor elements. It is also possible that the sensor device comprises more than two pellistor elements.

According to a further embodiment, a sensor assembly comprises the sensor device and a housing, wherein the sensor device is mounted in the housing. The housing can comprise at least one gas inlet, so that a surrounding gas can enter the housing and approach the sensor device. According to a further embodiment, in a method for manufacturing a sensor device at least a first pellistor element is produced.

The description before and in the following equally applies to the sensor device, the sensor assembly and the method for manufacturing the sensor device.

In particular, at least one pellistor element of the sensor device can comprise a heater element and a temperature sensor element. Preferably, every pellistor element of the sensor device comprises a heater element and a temperature sensor element. For example, the sensor device comprises a first pellistor element and a second pellistor element, wherein each of the first and the second pellistor elements can comprise features according to the embodiments described in the following. For instance, the first and second pellistor elements can be formed similarly in terms of materials and/or design parameters. The features described in the following in regard to pellistor elements, heater elements and temperature sensor elements can apply to at least one or more or preferably all pellistor elements of the sensor device.

When operated, the heater element of a pellistor element can increase the temperature of the pellistor element or at least of a part of the pellistor element. The temperature sensor element can be embodied and operated to measure the temperature of the pellistor element or of at least a part of the pellistor element. The heater element is preferably embodied as a heating filament or heating wire and, in particular, as a heating resistance. Preferably, the heater element comprises or is made of a noble metal as for example Pt. Other metals, for example W, are also possible in addition or alternatively. The temperature sensor element preferably comprises a material which changes its electrical resistance depending on its temperature. For example, the temperature sensor element can comprise a thermistor material, an NTC (negative temperature coefficient) material or a PTC (positive temperature coefficient) material. Furthermore, the temperature sensor element can comprise a noble metal and/or one or more metal oxides. For example, the noble metal comprises or is Pt. Furthermore, it can be possible that the heater element is the temperature sensor element. In other words, the heater element and the temperature sensor element can be one and the same component in a pellistor element and can be used for heating the pellistor element and, by measuring for example its temperature-dependent electrical resistance, for measuring the temperature. Alternatively, the heater element and the temperature sensor element can be embodied as two different components in a pellistor. Such pellistor can also be denoted as a microcalorimeter. The advantage of such design can be a higher sensitivity of the temperature sensor element to temperature changes compared to the heater element, so that forming the heater element and the temperature sensor element as different components can provide a higher measuring accuracy. The sensor device can have electrical contacts for contacting a pellistor element. In particular, the sensor device can have electrical contacts for contacting the heater element and the temperature sensor element of a pellistor element. At least some of the electrical contacts can be embodied for measuring at least one electrical property of the pellistor element and, in particular, of the temperature sensor element. The electrical property can be, for example, an electrical resistance, an electrical current an electrical voltage and/or an electrical capacitance.

According to a further embodiment, each of the one or more pellistor elements of the sensor device is embodied as a catalytic pellistor or as a thermal conductivity (TC) pellistor. A pellistor element embodied as a catalytic pellistor comprises a catalyst element and, when operated by heating at least the catalyst element by means of the heater element, works by burning a gas to be examined (target gas) on the surface of the catalyst element. The additional heat that is generated by the gas combustion process on the surface of the catalyst element can be detected by means of the temperature sensor element and preferably can be used to produce a sensor signal that is proportional to the gas concentration. The catalyst element can comprise a metal oxide. The metal oxide can for instance comprise Al and/or Pt. For example, the catalyst element can comprise or consist of platinum oxide and/or aluminum oxide or aluminum oxide mixed with platinum. In case of a TC pellistor, the catalyst element is missing. The temperature sensor element of the TC pellistor element, when the pellistor element is operated by heating the pellistor element by means of the heater element to a certain temperature, measures a temperature of the pellistor element which is influenced by the heat conductivity of the gas to be examined, since a change of the concentration or amount of the target gas in the surrounding air can change the heat conductivity of the surrounding air. In short, the TC pellistor element can be used to measure a gas concentration via detecting information about the heat conductivity of the surrounding gas atmosphere.

According to a further embodiment, the sensor device comprises a substrate. The substrate can carry the first pellistor element of the sensor device. In cases where the sensor device comprises more than one pellistor element, the substrate is preferably a common substrate, carrying all of the pellistor elements of the sensor device. Preferably, the substrate comprises silicon. The temperature sensor element of the first pellistor element and preferably the temperature sensor element of each of the pellistor elements of the sensor device can be arranged in or on a membrane, which is an integral part of the substrate. Furthermore, also the heater element of the first pellistor element and preferably of each of the pellistor elements can be arranged in or on the membrane together with the respective temperature sensor element. In case that at least one pellistor element of the sensor device comprises a catalyst element, the catalyst element can be arranged on the membrane in order to have contact to the surrounding gas atmosphere. In particular, the heater element and the temperature sensor element of the first pellistor can be arranged in or on a first membrane of the substrate. In case the sensor device comprises a second pellistor element with a heater and a temperature sensor element, the heater and the temperature sensor element of the second pellistor element can be arranged in or on a second membrane of the substrate. Accordingly, the first membrane can carry the first pellistor, and, if applicable, the second membrane can carry the second pellistor. Consequently, each of the membranes of the sensor device can carry at least one pellistor element.

Each of the membranes of the sensor device, for instance the first membrane and, if applicable, also the second membrane, is monolithically integrated into the substrate. Thus, each of the membranes forms an integral part of the substrate and is durably connected to a massive part of the substrate. Each of the membranes comprises or is made of an electrically insulating material, for instance silicon oxide and/or silicon nitride, and at least partly or substantially completely encloses the heater element and/or the temperature element. The material of the membrane(s) can be produced by oxidizing a part of the substrate material and/or by applying one or more layers. The substrate and each of the membranes with the components arranged in each of the membranes can be manufactured by standard MEMS (microelectromechanical systems) technology, thereby providing small dimensions and a high degree of integration. For example, when forming the membrane with the temperature sensor element and/or the heater element, lithographic process steps can be used. When manufacturing the sensor device, at least the first pellistor element or, preferably, all pellistor elements can be produced on the substrate. This can in particular mean that the components of at least the first pellistor element or, preferably, of all pellistor elements, are produced on and/or applied to the substrate. Before or after producing the pellistor element(s), the first membrane or, preferably, all membranes, can be produced so that the heater element and/or the temperature sensor element of each of the pellistor elements is arranged in or on the respective membrane. For instance, producing a membrane can include a step of removing substrate material.

According to a further embodiment, the substrate comprises at least a first cover layer. The first cover layer is preferably monolithically integrated into the substrate. Furthermore, the substrate can comprise more than one cover layer, wherein each of the cover layers is monolithically integrated into the substrate. As described above in connection with the one or more membranes, each of the one or more cover layers preferably forms an integral part of the substrate and is durably connected to a massive part of the substrate. Each of the cover layers can comprise or be made of silicon and/or an oxide and/or a nitride with silicon, for instance silicon oxide and/or silicon nitride, and/or with another metal or semimetal like, for example, aluminum.

According to a further embodiment, the first cover layer is arranged over or under the first membrane. The terms "over" and "under" preferably refer to arrangement directions perpendicular to a main extension plane of the first membrane and to a usual orientation of the sensor device when mounted on a carrier. Consequently, the first cover layer can be arranged, in a direction perpendicular to the main extension plane of the first membrane, over or under the first membrane. In particular, the first membrane and the first cover layer can be arranged at a distance to each other so that there is a spacing between the first membrane and the first cover layer. Preferably, the spacing is formed by a first cavity, wherein the first membrane, the first cover layer and a part of the substrate surround the first cavity.

According to a further embodiment, the first cover layer is a gas barrier layer. In other words, the first cover layer is impermeable to the gas atmosphere surrounding the sensor device, so that the first membrane and, in particular, the first pellistor element, is sealed from the surrounding gas at least from the side of the first cover layer. In this case, the first cavity can contain a reference gas or, preferably, can contain a vacuum. Here and in the following the term "vacuum" denotes atmospheric conditions which are typically used in physical or chemical deposition processes. Accordingly, the term "vacuum" can includes gas conditions with a pressure of equal to or less than 300 hPa, which can be denoted as rough vacuum, or equal to or less than 1 hPa, which can be denoted as fine vacuum, or equal to or less than $10^{-3}$ hPa, which can be denoted as high vacuum or even ultra-high vacuum depending on the pressure. Alternatively, the first cover layer comprises at least one opening, which can, preferably, also mean a plurality of openings. Due to the at least one opening, the first cavity can be open to the gas atmosphere surrounding the sensor device so that the surrounding gas can enter the first cavity and approach the first pellistor element at least from the side of the first cover layer. Alternatively or additionally, the first membrane can comprise at least one opening, so that gas that is present on the side of the first membrane opposite the first cover layer can enter the first cavity from that side.

The first cover layer can be formed as a thin layer having a thickness similar to the thickness of the first membrane and similar to or smaller than a height of the first cavity measured along a direction perpendicular to the main extension plane of the first membrane. "A thickness similar" to another measure like another thickness or a height can in particular mean that the thickness and the other measure are within the same order of magnitude. In other words, the first cover layer can be a membrane. Alternatively, the first cover layer can be formed as a thick layer which has a thickness greater than the thickness of the first membrane and/or greater than a height of the first cavity measured along a direction perpendicular to the main extension plane of the first membrane.

When manufacturing the sensor device, the first cover layer can be produced for example after the production of the first pellistor element. A sacrificial layer can be deposited on the first pellistor element, which can imply that the sacrificial layer is deposited on the first membrane. Furthermore, a cover material can be deposited on the sacrificial material, wherein the cover material comprises at least one opening. For instance, the cover material can be deposited as a contiguous layer and can be patterned afterwards to form at least one opening. Afterwards, at least a part of the sacrificial material is removed through the at least one opening in the cover material, so that the first cavity is formed between the first pellistor element and the cover material. Preferably, all sacrificial material or at least substantially all sacrificial material is removed. In addition to the sacrificial material further materials can be deposited, for instance one or more etch stop layers, which can facilitate the manufacture of the first cavity.

The cover material can form the first cover layer or at least a part of a first cover layer. In particular in case of the first cover layer forming a gas barrier layer, the at least one opening in the cover material can be closed after the removal of the sacrificial material. For applying material and/or for closing the at least one opening, physical or chemical deposition methods can be used as, for instance, plasma-enhanced chemical vapor deposition (PECVD). Accordingly, the at least one opening can be closed by depositing a further cover material on the cover material, the cover material and the further cover material forming the first cover layer. It can also be possible that the first cover layer is produced before the first membrane is produced. Also in this case the first cavity can be formed by removing a sacrificial material.

According to a further embodiment, the substrate comprises a second cover layer, wherein the second cover layer is monolithically integrated into the substrate and is arranged on a side of the first membrane opposite to the first cover layer. The second cover layer can comprise one or more features described before in connection with the first cover layer. In particular, the second cover layer can be produced using method steps similar to the steps described before in connection with the first cover layer. Preferably, the first membrane, the second cover layer and a part of the substrate can surround a second cavity, wherein the second cavity can comprise one or more features as described above in connection with the first cavity. For instance, the second cover layer can be a gas barrier layer so that the second cavity can contain vacuum or a reference gas, or the second cover layer can comprise at least one opening.

According to a further embodiment, the sensor device comprises a second membrane monolithically integrated into the substrate and a second pellistor element as described above, the second pellistor element being carried by the second membrane. The first and the second membrane can be arranged laterally to each other. Here and in the following, "laterally" can mean a direction parallel to the main extension plane of the first and the second membrane. In case of a second membrane carrying a second pellistor, the sensor device can comprise a third cover layer that is arranged over or under the second membrane, wherein the second membrane, the third cover layer and a part of the substrate surround a third cavity. Additionally, the sensor device can comprise a fourth cover layer that is arranged on a side of the second membrane opposite to the third cover layer. In particular, the third cover layer, the third cavity, the fourth cover layer and the fourth cavity can each comprise one or more features as described in connection with the first and second cover layers and the first and second cavities.

According to a further embodiment, the sensor device comprises at least one active pellistor element and at least one reference pellistor element. The first pellistor element can for instance form the reference pellistor element, while the second pellistor element can form the active pellistor element. Accordingly, the second pellistor element can have, for instance, a third cover layer having at least one opening so that the surrounding gas can approach the second pellistor element, whereas the first pellistor element can be sealed from that surrounding gas for instance by the first cover layer or by both the first cover layer and a second cover layer as described above. When operating the sensor device, the reference pellistor element can be heated similarly to the active pellistor element, for example by using the same or substantially the same electrical current. It can be also possible that the reference pellistor element can be heated to a different temperature compared to the active pellistor element. In both cases, the reference pellistor element can work as a compensator. In particular, the active pellistor element and the reference pellistor element can be integrated in a compensator circuit as, for instance, a Wheatstone Bridge. The combination of the active pellistor element and the reference pellistor element can provide information about gas concentration changes in the surrounding gas atmosphere, while other environmental changes as, for instance, a change in humidity and/or a change in the ambient temperature will be cancelled out or at least suppressed.

With the sensor device and the method for manufacturing the sensor device as described above, it is possible to the produce a reference pellistor element on a substrate level, for instance by MEMS technology. Thus, it is possible to provide a miniaturized, low-cost reference pellistor that is completely manufactured using silicon technology and that can be integrated in a sensor device having an active pellistor element.

BRIEF DESCRIPTION OF THE DRAWINGS

Further features, advantages and expediencies will become apparent from the following description of exemplary embodiments in conjunction with the figures.

FIGS. 1A to 1E show schematic illustrations of method steps of a method for manufacturing a sensor device according to an embodiment;

FIGS. 2A, 2B and 3 to 5 show schematic illustrations of sensor devices according to further embodiments.

In the figures, elements of the same design and/or function are identified by the same reference numerals. It is to be understood that the embodiments shown in the figures are illustrative representations and are not necessarily drawn to scale.

DETAILED DESCRIPTION OF ILLUSTRATIVE EMBODIMENTS

FIGS. 1A to 1E show method steps of a method for manufacturing a sensor device 100 according to an embodiment.

Figure 1A:
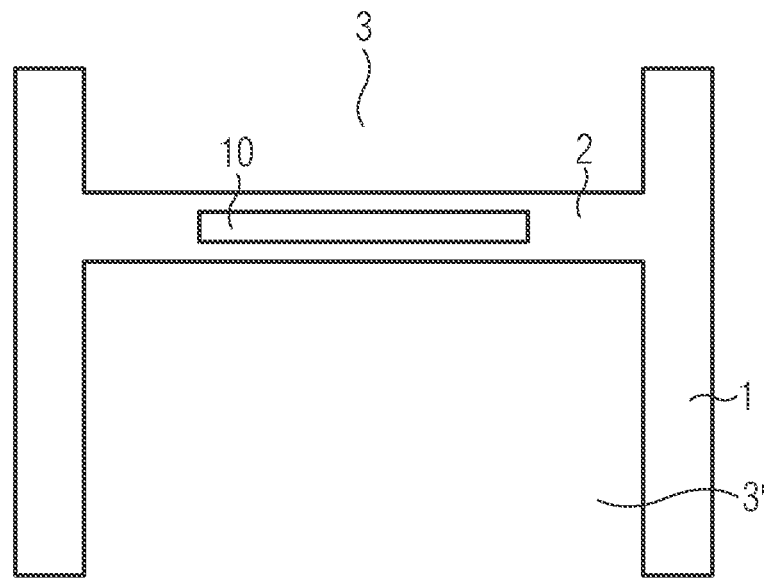

As shown in FIG. 1A, a substrate 1 is provided for manufacturing the sensor device 100, which is shown in FIG. 1E. A first membrane 2 is produced in the substrate 1, wherein the first membrane is monolithically integrated into the substrate 1 and carries a first pellistor element 10. The substrate 1 and, in particular, the first membrane 2 with the first pellistor element 10 are preferably manufactured by standard MEMS (microelectromechanical system) technology, thereby providing small dimensions and a high degree of integration. As schematically indicated in FIG. 1A, the substrate 1 comprises a massive part that is integrally connected to the first membrane 2 and that comprises two recesses 3, 3'. It can also be possible that for instance the recess 3' under the first membrane 2 is produced after one of the following method steps. The recesses 3, 3' can be produced, for instance, by DRIE (deep reactive-ion etching) or another suitable etching method.

Figure 1B:
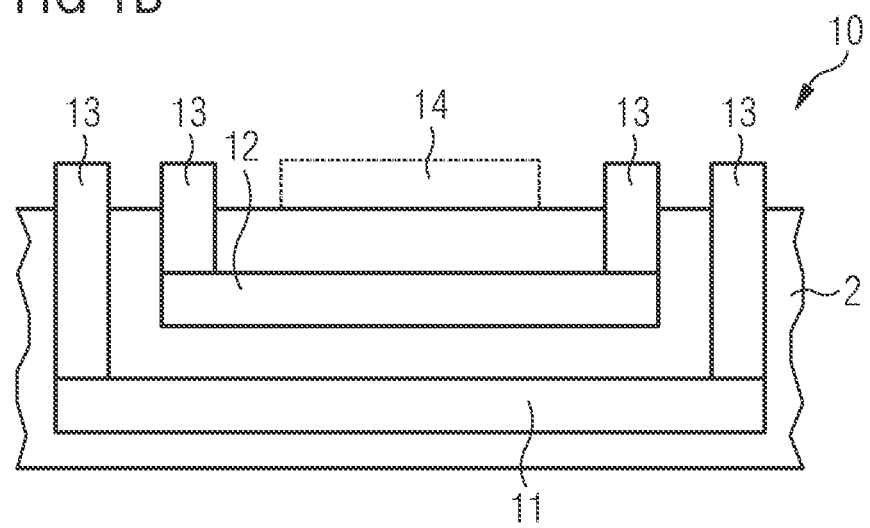

The first membrane 2 and the first pellistor element 10 are shown in more detail in FIG. 1B. The first pellistor element 10 comprises a heater element 11 and a temperature sensor element 12 integrated into the first membrane 2. Alternatively, at least one of the heater element 11 and the temperature sensor element 12 can be arranged on the first membrane 2. The first membrane 2 comprises or is made of an electrically insulating material, for instance silicon oxide and/or silicon nitride, and can, as shown, substantially completely enclose the heater element 11 and/or the temperature element 12. The heater element 11 is embodied as a heating filament or heating wire in the form of a heating resistance and is integrated into the membrane 2. For example, the heater element 11 comprises or is made of a noble metal as for example Pt and/or W. The temperature sensor element 12 is also integrated into the membrane 2 and comprises a material which changes its electrical resistance depending on its temperature. For instance, the temperature sensor element 12 comprises or is made of a thermistor material, an NTC material or a PTC material. For example, the temperature sensor element 12 can comprise a noble metal and/or one or more metal oxides. For example, the noble metal comprises or is Pt. Furthermore, electrical contacts 13 are provided for contacting the heater element 11 and the temperature sensor element 12 of the first pellistor element 10.

The shown first pellistor element 10 is a TC pellistor and is embodied as a microcalorimeter. When the first pellistor element 10 is operated, the heater 11 is used to heat at least a part of the first pellistor element 10. The temperature sensor element 12 is used to measure the temperature of the first pellistor element 10 or of at least a part thereof, wherein the temperature can depend, as described in the general part, on the concentration of gases in the surrounding gas atmosphere. It can also be possible that the heater element 11 and the temperature sensor element 12 are one and the same component in the first pellistor element 10 that can be used for heating and, by measuring for example its temperature-dependent electrical resistance, for measuring the temperature.

As indicated in FIG. 1B, the first pellistor element 10 can also be embodied as a catalytic pellistor and can comprise a catalyst element 14, which can comprise a metal oxide. The metal oxide can for instance comprise Al and/or Pt. For example, the catalyst element 14 can comprise or consist of platinum oxide and/or aluminum oxide or aluminum oxide mixed with platinum.

In further method steps, as indicated in FIGS. 1C to 1E, a first cover layer 5 is manufactured that is monolithically integrated into the substrate 1 and that is arranged over the first membrane 2. As shown in FIG. 1C, a sacrificial material 4 is deposited on the first membrane 2 in one of the recesses 3, 3". The sacrificial material 4 can comprise a material that can be removed later on, for instance by etching, without removing significant parts of the substrate 1, the first membrane 2 with the first pellistor element 10 and the first cover layer 5. In addition, further materials as, for instance, etch stop layers can be deposited (not shown) that can facilitate the manufacture of the first cover layer 5. Depending on the etching materials and parameters the sacrificial material can for example comprise an oxide and/or nitride and/or a photoresist.

On the sacrificial material 4 a cover material 50 is provided as shown in FIG. 1D. The cover material 50 can comprise or be made of silicon and/or an oxide and/or a nitride with silicon, for instance silicon oxide and/or silicon nitride, and/or with another metal or semimetal like, for example, aluminum. Accordingly, the cover material 50 is arranged at a distance to the first membrane 2. The cover material 50 is preferably deposited as a contiguous layer that is patterned afterwards to form at least one opening 51 in the cover material 50. Alternatively, the cover material 50 can be deposited in a patterned way, for instance by using a mask-based process. In the shown embodiment, a plurality of openings 51 is provided.

Afterwards, as shown in FIG. 1E, at least a part of the sacrificial material 4 or, preferably, all or at least substantially all sacrificial material 4 is removed through the at least one opening 51 in the cover material 50. The remaining cover material 50 forms the first cover layer 5 over a first cavity 6. In other words, the first cavity 6 is formed between the first pellistor element 10 and the first cover layer 5. Due to the at least one opening 51, the first cavity 6 can be open to the gas atmosphere surrounding the sensor device 100 so that the surrounding gas can enter the first cavity 6 and approach the first pellistor element 10 at least from the side of the first cover layer 5.

In connection with the following figures, further embodiments of method steps and of the sensor device 100 are shown. The following description mainly refers to differences and modifications in comparison to foregoing embodiments. Features of an embodiment shown in a figure that are not explicitly described can be embodied as described in connection with foregoing figures and/or as described in the general part.

As indicated in FIGS. 2A and 2B, the first cover layer 5 can be embodied as a gas barrier layer and can be impermeable to the gas atmosphere surrounding the sensor device 100, so that the first membrane 2 and, in particular, the first pellistor element 10, is sealed from the surrounding gas at least from the side of the first cover layer 5. In this case, the first cavity 6 can contain a reference gas or, preferably, can contain a vacuum. For manufacturing the first cover layer 5 as a gas barrier layer, the openings in the cover material 50 are closed after the removal of the sacrificial material. For applying material and/or for closing the openings, physical or chemical deposition methods can be used as, for instance, plasma-enhanced chemical vapor deposition (PECVD). Accordingly, the openings are closed by depositing a further cover material 52 on the cover material 50, the cover material 50 and the further cover material 52 forming the first cover layer 5. Since a PECVD process is usually performed under vacuum conditions, the first cavity 6 can preferably contain a vacuum after closing the openings in the cover material 50.

As shown in FIGS. 1E and 2A, the first cover layer 5 can be formed as a thin layer having a thickness for instance similar to the thickness of the first membrane 2 and similar to or smaller than a height of the first cavity 6 measured along a direction perpendicular to the main extension plane of the first membrane 2. Consequently, the first cover layer 5 can also be a membrane. Alternatively, as shown in FIG. 2B, the first cover layer 5 can be formed as a thick layer which has a thickness greater than the thickness of the first membrane 2 and/or greater than a height of the first cavity 6 measured along a direction perpendicular to the main extension plane of the first membrane 2. In this case, more of the further cover material, which can also mean more further cover materials, can be applied on the cover material 50 to form the thicker first cover layer 5.

As shown in FIGS. 3 and 4, the structure of the sensor device 100 can also comprise three membranes. In addition to the first membrane 2 carrying the first pellistor element 10 and to the first cover layer 5 as described before, the sensor device 100 can comprise a second cover layer 5', wherein the second cover layer 5' is monolithically integrated into the substrate 1 and is arranged on a side of the first membrane 2 opposite to the first cover layer 5. The second cover layer 5' can for instance be embodied similarly to the first cover layer 5. In particular, the second cover layer 5' can be produced using method steps similar to the steps described before in connection with the first cover layer 5. The first membrane 2, the second cover layer 5' and a part of the substrate 1 surround a second cavity 6'. By way of example, the first cover layer 5 and the second cover layer 5' of the sensor device 100 shown in FIG. 3 are both embodied as gas barrier layers, so that both the first cavity 6 and the second cavity 6' can for instance contain a vacuum or a reference gas. It can also be possible that at least one of the cover layers 5, 5' is formed as a thick cover layer as explained in connection with FIG. 2B. It can also be possible that the second cover layer 5' is formed by a part of the substrate 1. In this case the second cavity 6' and the first membrane 2 can be formed using method steps similarly to the method steps described in connection with manufacture of the first cover layer 5.

FIG. 4 shows a further embodiment of a sensor device 100, which has a first and a second cover layer 5, 5' with openings 51. It can also be possible that only one of the cover layers 5, 5' has openings 51, while the other of the cover layers 5, 5' forms a gas barrier layer.

Figure 5:
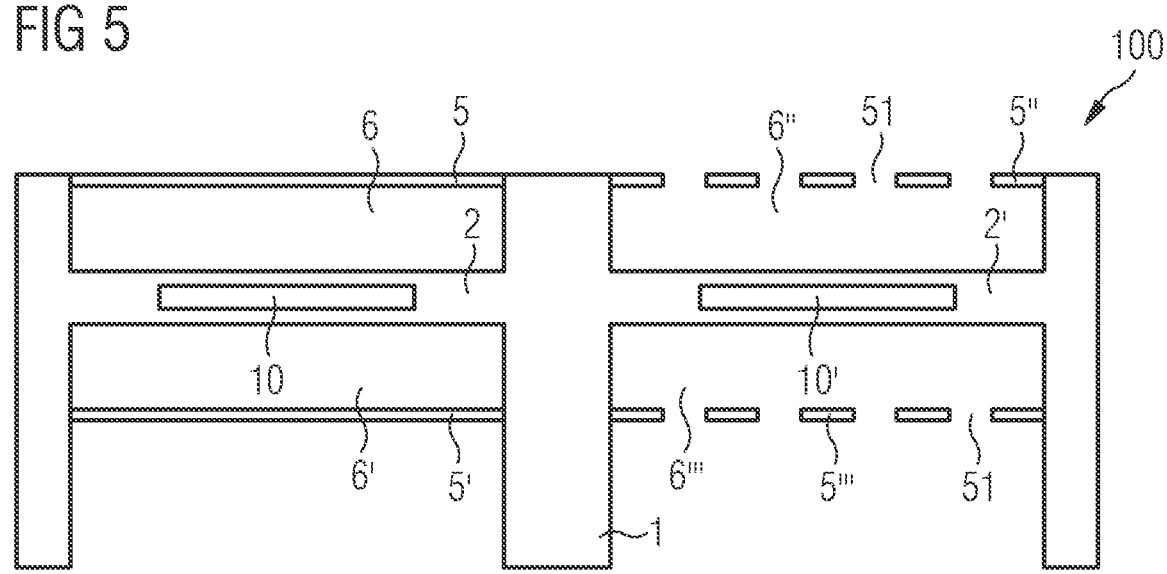

FIG. 5 shows a further embodiment of a sensor device 100, which, in comparison to the foregoing embodiments, additionally has a second membrane 2' carrying a second pellistor 10'. The first and the second membrane 2, 2' are arranged laterally to each other and are both monolithically integrated into the substrate 1.

The sensor device 100 further comprises a third cover layer 5" arranged over the second membrane 2' and covering a third cavity 6" as well as a fourth cover layer 5''' arranged under the second membrane 2' and covering a fourth cavity 6''', wherein both cover layers 5", 5''' are monolithically integrated into the substrate as described above. Both cover layers 5", 5''' have at least one opening 51 and, in particular, a plurality of openings 51, respectively. The shown sensor device 100 can be understood as a combination of the sensor devices 100 according to the embodiments of FIGS. 3 and 4, so that the features described in connection with FIG. 3 can apply to the left hand part of the sensor device 100, while the features described in connection with FIG. 4 can apply for the right hand part of the sensor device 100. Alternatively, other combinations of features of all foregoing embodiments are possible.

In particular, in the shown embodiment the first pellistor element 10 is sealed from the surrounding gas atmosphere by the first and second cover layer 5, 5', whereas the second pellistor element 10' can have contact to the surrounding gas atmosphere due to the openings 51 in the third and fourth cover layer 5", 5'''. The first pellistor element 10 can form a monolithically integrated reference pellistor element, while the second pellistor element 10' can form a monolithically integrated active pellistor element. When operating the sensor device 100, the reference pellistor element can work as a compensator. In particular, the active pellistor element and the reference pellistor element can be integrated in a compensator circuit as, for instance, a Wheatstone Bridge. The combination of the active pellistor element and the reference pellistor element can provide information about gas concentration changes in the surrounding gas atmosphere, while other environmental changes as, for instance, a change in humidity and/or a change in the ambient temperature will be cancelled out or at least suppressed.

The sensor device 100 according to the foregoing embodiments can be arranged and mounted in a housing, thereby forming a sensor assembly. The housing has at least one gas inlet, so that a surrounding gas can enter the housing and approach the sensor device.

Figure 6:
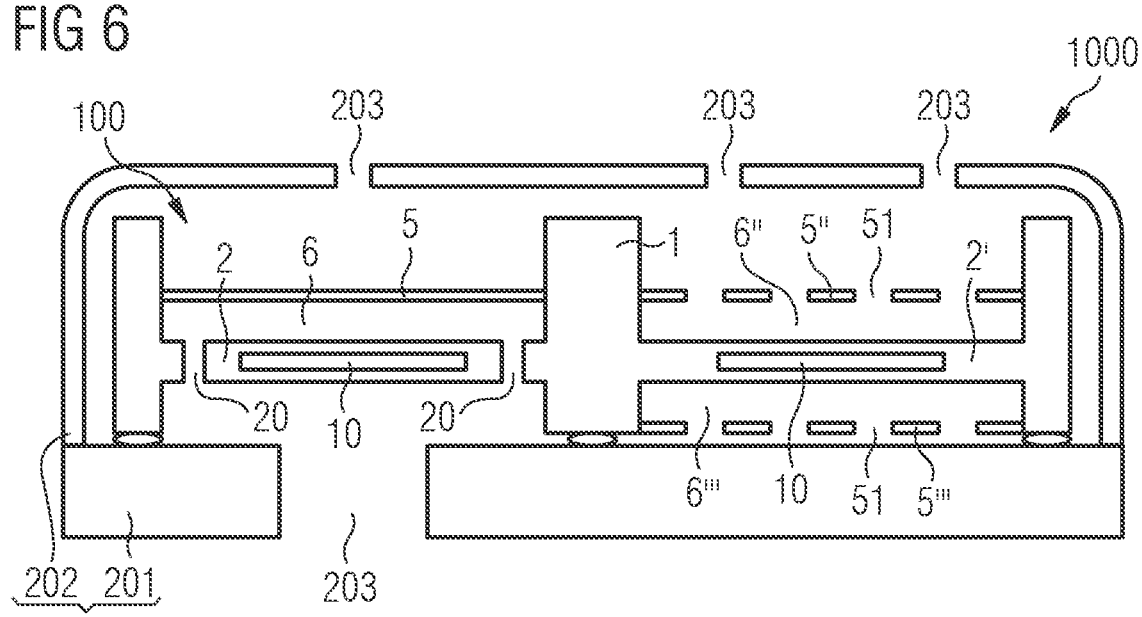
FIG. 6 shows a schematic illustration of a sensor assembly according to a further embodiment.

FIG. 6 shows a sensor assembly 1000 with a sensor device 100 in a housing 200 according to a further embodiment. The housing 200 comprises a carrier board 201, onto which the sensor device 100 is mounted, for instance by soldering the substrate 1 to the carrier board 201. The carrier board 201 can be a ceramic-, metal- and/or plastic-based circuit board, for example a printed circuit board. The housing 200 further comprises a cap 202 that is mounted on the carrier board 201 covering the sensor device 100 and that can be a cap based on metal and/or plastic material. For example, the cap 202 can be mounted to the carrier board 201 by soldering or gluing. The housing 200 can for instance form a standard package used for gas sensors.

The housing 200 further comprises gas inlets 203, wherein the shapes and positions as well as the number of the gas inlets 203 are shown only by way of example. For example, one or more gas inlets 203 can comprise a fitting, an adapter and/or a feed pipe or other means to connect the respective gas inlet 203 to a gas supply. Furthermore, it is also possible that only the carrier board 201 or only the cap 202 has one or more gas inlets 203. Such housing could be used for instance with the sensor devices 100 shown in the foregoing embodiments. In the embodiment shown in FIG. 6, both the carrier board 201 and the cap 202 have at least one gas inlet 203.

Furthermore, the sensor device 100 comprises a first pellistor 10 on a first membrane 2, wherein the first pellistor element 10 is sealed by a first cover layer 5 that forms a gas barrier layer from gas entering the housing 200 through the gas inlets 203 in the cap 202. However, gas entering the housing 200 through the gas inlet 203 in the carrier board 201 can approach the first pellistor element 10. Additionally, the first membrane 2 has openings 20 which connect the first cavity 6 to the side of the first membrane 2 opposite to the first cover layer 5, so that the gas entering the housing 200 through the gas inlet 203 in the carrier board 201 can approach the first pellistor element 10 from both sides. The sensor device 100 comprises a second pellistor element 10', covered by a third and fourth cover layer 5", 5''' with openings 51 as in the embodiment according to FIG. 5. While the second pellistor element 10' is sealed by the connecting material between the substrate 1 and the carrier board 201, which can be a solder material or an adhesive, from gas entering the housing 200 through the gas inlet 203 in the carrier board 201, gas entering the housing 200 through the gas inlets 203 in the cap 202 can enter at least the third cavity 6" and thus approach the second pellistor element 10'. Consequently, the first and the second pellistor elements 10, 10' can be exposed to different gases. For example, the gas inlet 203 in the carrier board 201 can be used for allowing a reference gas to enter, while the gas inlets 203 in the cap 202 can be used to allow a gas to be examined to enter.

Alternatively or additionally to the features described in connection with the figures, the embodiments shown in the figures can comprise further features described in the general part of the description. Moreover, features and embodiments of the figures can be combined with each other, even if such combination is not explicitly described.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

What is claimed is:

1. A sensor device comprising:
   a substrate with a first membrane and a first cover layer, the first membrane and the first cover layer being monolithically integrated into the substrate; and
   a first pellistor element comprising a heater element and a temperature sensor element, the heater element and/or the temperature sensor element being arranged in or on the first membrane,
   wherein the first membrane, the first cover layer and a part of the substrate surround a first cavity, and
   wherein the first cover layer is arranged over or under the first membrane and extends over the first cavity.

2. The sensor device according to claim 1, wherein the first cover layer is a gas barrier layer.

3. The sensor device according to claim 2, wherein a vacuum is present in the first cavity.

4. The sensor device according to claim 1, wherein the first membrane comprises at least one opening.

5. The sensor device according to claim 1, wherein the first cover layer comprises at least one opening.

6. The sensor device according to claim 1, wherein the first cover layer is a membrane.

7. The sensor device according to claim 1, wherein the substrate comprises a second cover layer, the second cover layer being monolithically integrated into the substrate and being arranged on a side of the first membrane opposite to the first cover layer.

8. The sensor device according to claim 7, wherein the first membrane, the second cover layer and a part of the substrate surround a second cavity.

9. The sensor device according to claim 1, further comprising:
   a second membrane monolithically integrated into the substrate; and
   a second pellistor element,
   wherein the second pellistor element comprises a heater element and a temperature sensor element, the heater element and/or the temperature sensor element being arranged in or on the second membrane.

10. The sensor device according to claim 9, further comprising a third cover layer arranged over or under the second membrane, wherein the second membrane, the third cover layer and a part of the substrate surround a third cavity.

11. A sensor assembly comprising:
    the sensor device according to claim 1, wherein the sensor device is mounted in a housing comprising at least one gas inlet.

12. A method for manufacturing the sensor device according to claim 1, the method comprising:
    producing the first pellistor element on the substrate, the first pellistor element comprising the heater element and the temperature sensor element;
    producing the first membrane so that the heater element and/or the temperature sensor element is/are arranged in or on the first membrane;
    depositing a sacrificial material on the first pellistor element;
    depositing a cover material on the sacrificial material, the cover material comprising at least one opening; and
    removing at least a part of the sacrificial material through the at least one opening, so that the first cavity is formed between the first pellistor element and the cover material,
    wherein the cover material forms at least a part of the first cover layer.

13. The method according to claim 12, wherein the at least one opening is closed after removal of the sacrificial material.

14. The method according to claim 13, wherein the at least one opening is closed by depositing a further cover material on the cover material, the cover material and the further cover material forming the first cover layer.

15. A sensor device comprising:
    a substrate with a first membrane and a first cover layer, the first membrane and the first cover layer being monolithically integrated into the substrate; and
    a first pellistor element comprising a heater element and a temperature sensor element, the heater element and/or the temperature sensor element being arranged in or on the first membrane,
    wherein the first cover layer is arranged over or under the first membrane,
    wherein the first membrane, the first cover layer and a part of the substrate surround a first cavity,
    wherein the first cover layer is a gas barrier layer, and
    wherein a vacuum is present in the first cavity.

16. The sensor device according to claim 15, wherein the first membrane comprises at least one opening.

17. The sensor device according to claim 15, wherein the first cover layer comprises at least one opening.

18. The sensor device according to claim 15, wherein the first cover layer is a membrane.

19. A sensor device comprising:
    a substrate with a first membrane and a first cover layer, the first membrane and the first cover layer being monolithically integrated into the substrate; and
    a first pellistor element comprising a heater element and a temperature sensor element, the heater element and/or the temperature sensor element being arranged in or on the first membrane,
    wherein the first cover layer is arranged over or under the first membrane,
    wherein the first membrane, the first cover layer and a part of the substrate surround a first cavity,
    wherein the substrate comprises a second cover layer, the second cover layer being monolithically integrated into the substrate and being arranged on a side of the first membrane opposite to the first cover layer.

20. The sensor device according to claim 19, wherein the first membrane, the second cover layer and a part of the substrate surround a second cavity.

\* \* \* \* \*